(12) United States Patent
Hung et al.

(10) Patent No.: US 9,450,577 B1
(45) Date of Patent: Sep. 20, 2016

(54) CIRCUIT WITH OUTPUT SWITCH (71) Applicant: Macronix International Co., Ltd., Hsinchu (TW)

(72) Inventors: Chun-Hsiung Hung, Hsinchu (TW); Kuen-Long Chang, Taipei (TW); Ken-Hui Chen, Taipei (TW); Su-Chueh Lo, Hsinchu (TW); Tzu-Ting Chiu, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/742,160

(22) Filed: Jun. 17, 2015

(51) Int. Cl.
*H03K 3/00* (2006.01)
*H03K 17/16* (2006.01)

(52) U.S. Cl.
CPC .................................. *H03K 17/165* (2013.01)

(58) Field of Classification Search
None
See application file for complete search history.

(56) References Cited

U.S. PATENT DOCUMENTS

| | | | | |
|---|---|---|---|---|
| 5,382,846 A * | 1/1995 | Shigehara | ........ | H03K 19/00361 326/80 |
| 6,351,158 B1 * | 2/2002 | Shearon | ........... | H03K 19/00315 327/108 |
| 7,193,274 B2 * | 3/2007 | Liu | ..................... | H01L 27/0266 257/355 |

* cited by examiner

*Primary Examiner* — Long Nguyen
(74) *Attorney, Agent, or Firm* — Finnegan, Henderson, Farabow, Garrett & Dunner LLP (57) ABSTRACT

An output circuit includes: an output switch including a gate terminal, a drain terminal coupled to an external I/O bus, and a well terminal; a well control circuit, having a well terminal coupled to the well terminal of the output switch, to maintain a well voltage of the output switch at a level not less than a greater of a first voltage and a second voltage; and a gate control circuit coupled to the gate terminal and a the drain terminal of the output switch and to the external I/O bus, and operable to turn off the output switch, to prevent current flow through the output switch from the external I/O bus when an operating voltage of the output circuit is not applied to the output switch, and a bus voltage from an external device is present on the external I/O bus.

16 Claims, 8 Drawing Sheets

CIRCUIT WITH OUTPUT SWITCH

FIELD OF THE DISCLOSURE

The present disclosure generally relates to an output buffer circuit for use in an integrated semiconductor circuit device and, more particularly, to an output buffer circuit that prevents current back flow when the device is powered down.

BACKGROUND OF THE DISCLOSURE

Output buffer circuits are commonly implemented in semiconductor integrated circuits including, for example, memory circuits and logic circuits, as a means of transferring and amplifying signals provided to an input buffer circuit of another device. Chips as used herein refer to semiconductor integrated circuits. Chips may share an external I/O bus through which they communicate with each other via their respective input and output buffer circuits coupled to the I/O bus.

Figure 1:
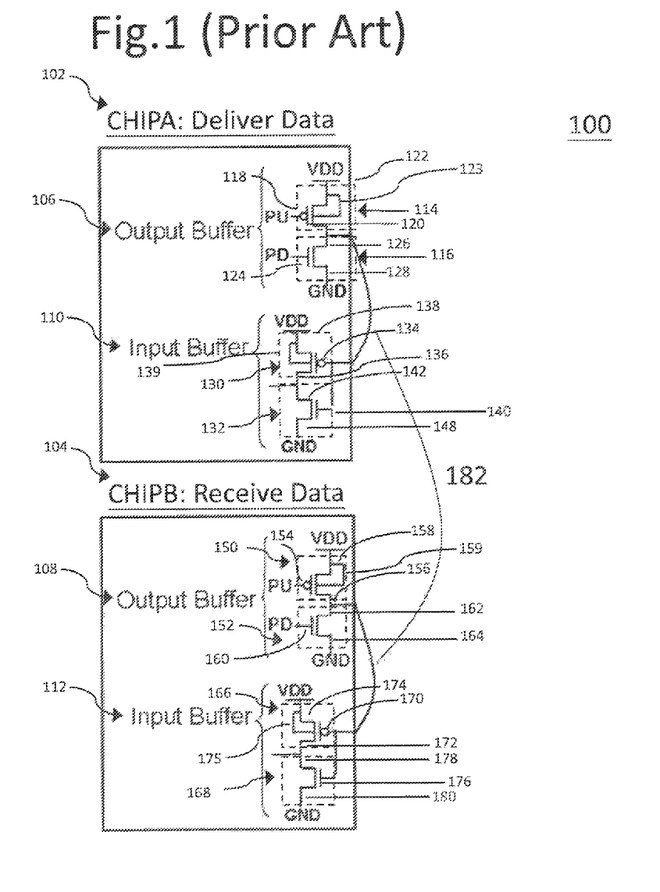
FIG. 1 is a block diagram of a conventional system in which chips share a common external I/O bus.

FIG. 1 illustrates a block diagram of a conventional system 100 in which a Chip A 102 and a Chip B 104 share an external I/O bus. Chip A 102 and Chip B 104 include output buffer circuits 106 and 108, respectively, and input buffer circuits 110 and 112, respectively. The output buffer circuit 106 of Chip A 102 includes a pMOS transistor 114 and an nMOS transistor 116. The pMOS transistor 114 includes a Pull-Up (PU) gate terminal 118, a drain terminal 120, a source terminal 122, and a well terminal 123. The well terminal 123 is coupled to the source terminal 122, which is in turn coupled to receive a voltage VDD. The nMOS transistor 116 includes a Pull-Down (PD) gate terminal 124, a drain terminal 126, and a source terminal 128. The drain terminal 126 of the nMOS transistor 116 is coupled to the drain terminal 120 of the pMOS transistor 114. The input buffer circuit 110 of Chip A 102 includes a pMOS transistor 130 and an nMOS transistor 132. The pMOS transistor 130 includes a gate terminal 134, a drain terminal 136, a source terminal 138, and a well terminal 139. The well terminal 139 is coupled to the source terminal 138 which is coupled to receive the voltage VDD. The nMOS transistor 132 includes a gate terminal 140, a drain terminal 142, and a source terminal 148. The drain terminal 142 of the nMOS transistor 132 is coupled to the drain terminal 136 of the pMOS transistor 130.

The output buffer circuit 108 of Chip B 104 includes a pMOS transistor 150 and an nMOS transistor 152. The pMOS transistor includes a PU gate terminal 154, a drain terminal 156, a source terminal 158, and a well terminal 159. The well terminal 159 is coupled to the source terminal 158 which is coupled to receive the voltage VDD. The nMOS transistor 152 includes a PD gate terminal 160, a drain terminal 162, and a source terminal 164 coupled to the drain terminal 156 of the pMOS transistor 150. The input buffer circuit 112 of Chip B 104 includes a pMOS transistor 166 and an nMOS transistor 168. The pMOS transistor 166 includes a gate terminal 170, a drain terminal 172, a source terminal 174, and a well terminal 175. The well terminal 175 is coupled to the source terminal 174 which is in turn coupled to receive the voltage VDD. The nMOS transistor 168 includes a gate terminal 176, a drain terminal 178, and a source terminal 180. The drain terminal 178 of the nMOS transistor 168 is coupled to the drain terminal 172 of the pMOS transistor 166.

An external I/O bus 182 couples Chip A 102 with Chip B 104. Referring to Chip A 102, the external I/O bus 182 is coupled to the drain terminal 120 of pMOS transistor 114, the drain terminal 126 of nMOS transistor 116, the gate terminal 134 of pMOS transistor 130, and the gate terminal 140 of nMOS transistor 132. Referring to Chip B 104, the external I/O bus 182 is coupled to the drain terminal 156 of pMOS transistor 150, the drain terminal 162 of nMOS transistor 152, the gate terminal 170 of pMOS transistor 166, and the gate terminal 176 of nMOS transistor 168. By coupling the external I/O bus 182 between Chip A 102 and Chip B 104, a data signal from Chip A 102 may be sent to Chip B 104. More particularly, the output buffer circuit 106 of Chip A 102 sends a data signal through the I/O bus 182 to the input buffer circuit 112 of Chip B 104. Similarly, a data signal can be sent from Chip B 104 to Chip A 102.

SUMMARY

According to a first aspect of the present disclosure, there is provided an output circuit, including: an output switch including a gate terminal, a drain terminal coupled to an external I/O bus, and a well terminal; a well control circuit, having a well terminal coupled to the well terminal of the output switch, to maintain a well voltage of the output switch at a level not less than a greater of a first voltage and a second voltage; and a gate control circuit coupled to the gate terminal and the drain terminal of the output switch and to the external I/O bus, and operable to turn off the output switch, to prevent current flow through the output switch from the external I/O bus when the operating voltage of the output circuit is not applied to the output switch, and a bus voltage from an external device is present on the external I/O bus.

According to a second aspect of the present disclosure, there is provided an output circuit, including: an output switch operable, when on, to supply a data signal to an external I/O bus, the output switch including a gate terminal, a drain terminal, and a well terminal; a well control circuit, having a well terminal coupled to the well terminal of the output switch, to maintain a well voltage of the output switch at a level not less than a greater of a first voltage and a second voltage, the first voltage being an operating voltage of the output circuit minus D1, the second voltage being a bus voltage of the external I/O bus minus D2, each one of D1 and D2 being a positive value or zero; an input switch coupled to the gate terminal of the output switch; a gate control circuit coupled to the gate terminal and the drain terminal of the output switch, the external I/O bus, and the input switch; a bias voltage generator, coupled to a gate terminal of the input switch, to maintain a bias voltage greater than a sum of the operating voltage of the output circuit and a threshold voltage of the input switch; and a voltage discharging circuit coupled to the bias voltage generator, the well control circuit, and the gate terminal of the input switch to discharge the bias voltage generated by the bias voltage generator when the operating voltage of the output circuit decreases.

According to a third aspect of the present disclosure, there is provided an output circuit, including: an output switch operable, when on, to supply a data signal to an external I/O bus, the output switch including a gate terminal, a source/drain terminal, and a well terminal; a well control circuit, having a well terminal coupled to the well terminal of the output switch, to maintain a well voltage of the output switch at a level not less than a greater of a first voltage and a second voltage, the first voltage being an operating voltage of the output circuit minus D1, the second voltage being a bus voltage of the external I/O bus minus D2, each one of D1 and D2 being a positive value or zero; an input switch coupled between the source/drain terminal of the output switch and the external I/O bus and operable to disconnect the output switch from the I/O bus; a bias voltage generator, coupled to a gate terminal of the input switch, to maintain a bias voltage greater than a sum of the operating voltage of the output circuit and a threshold voltage of the input switch; and a voltage discharging circuit coupled to the bias voltage generator, the well control circuit, and the gate terminal of the input switch to discharge the bias voltage generated by the bias voltage generator when the operating voltage of the output circuit decreases.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to the present embodiments, examples of which are illustrated in the accompanying drawings. The following description refers to the accompanying drawings in which the same numbers in drawings represent the same or similar elements unless otherwise represented. The implementations set forth in the following description of exemplary embodiments do not represent all implementations consistent with the invention. Instead, they are merely examples of systems and methods consistent with aspects related to the invention as recited in the appended claims.

In exemplary embodiments, there is provided an output buffer circuit that includes an output switch, a gate control circuit, and a well control circuit. The output buffer circuit is coupled to an external I/O bus through the output switch.

More particularly, in exemplary embodiments, the output buffer circuit is configured to prevent current flow from the external I/O bus through the output switch when a circuit operating voltage is not applied to the output switch. The output buffer circuit is configured so that a bus voltage from the external I/O bus is coupled to the well control circuit and the gate control circuit.

Figure 2A:
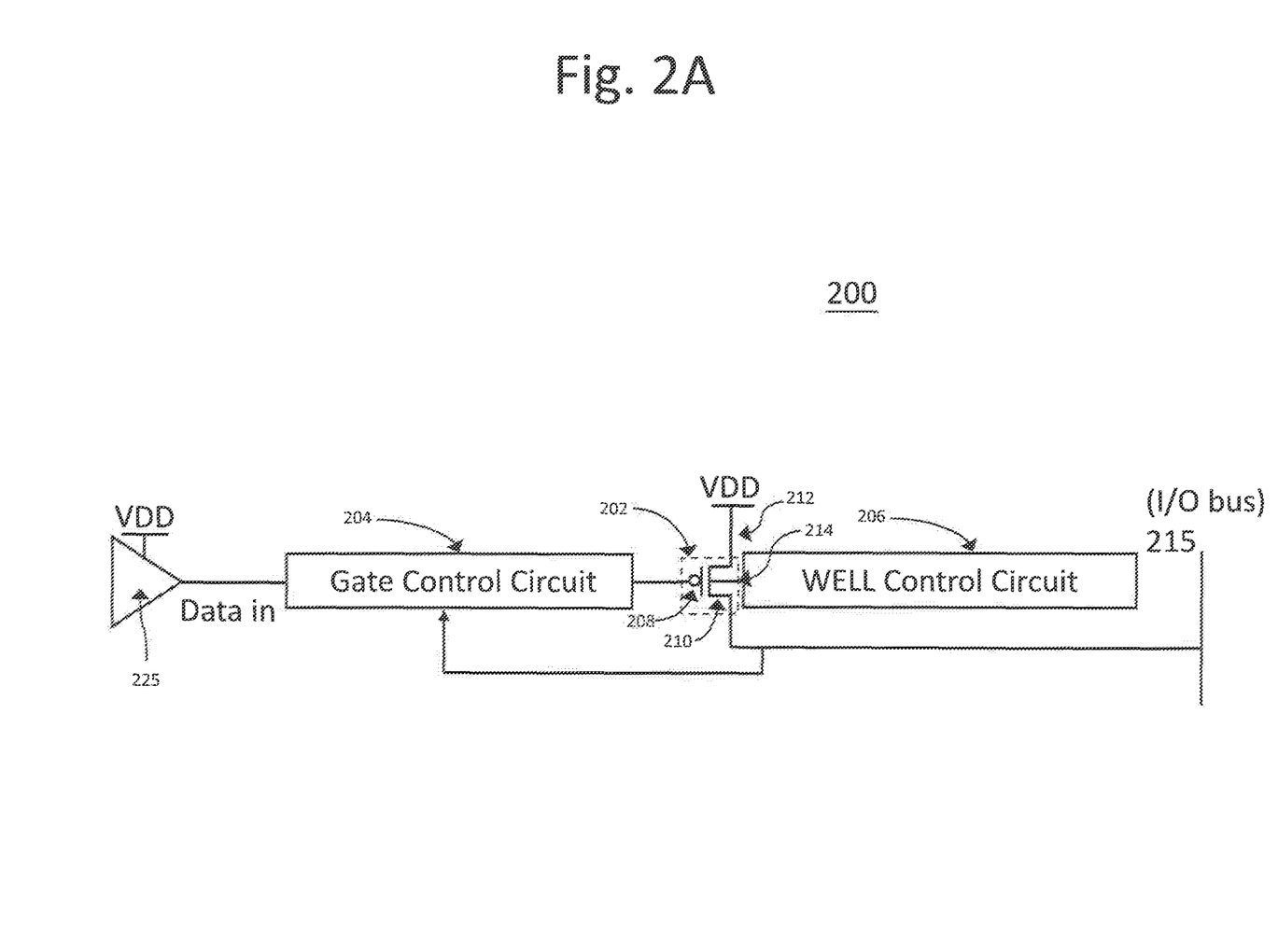
FIG. 2A is a schematic of a configuration of an output buffer circuit according to an exemplary embodiment.

FIG. 2A illustrates a schematic block diagram of an exemplary output buffer circuit 200. The output buffer circuit 200 includes an output switch, for example, a pMOS transistor 202, a gate control circuit 204, and a well control circuit 206. The gate control circuit 204 is coupled to an internal circuit 225 to receive data. The pMOS transistor 202 includes a gate terminal 208, a drain terminal 210, a source terminal 212, and a well terminal 214. The drain terminal 210 is coupled to the gate control circuit 204. The drain terminal 210 is also coupled to an external I/O bus 215 having a bus voltage. The source terminal 212 receives a circuit operating voltage VDD (i.e., the operating voltage of the internal circuit 225 and the output buffer circuit 200.) The gate terminal 208 of the pMOS transistor 202 is coupled to the gate control circuit 204. The well control circuit 206 is coupled to the well terminal 214 of the pMOS transistor 202.

Figure 2B:
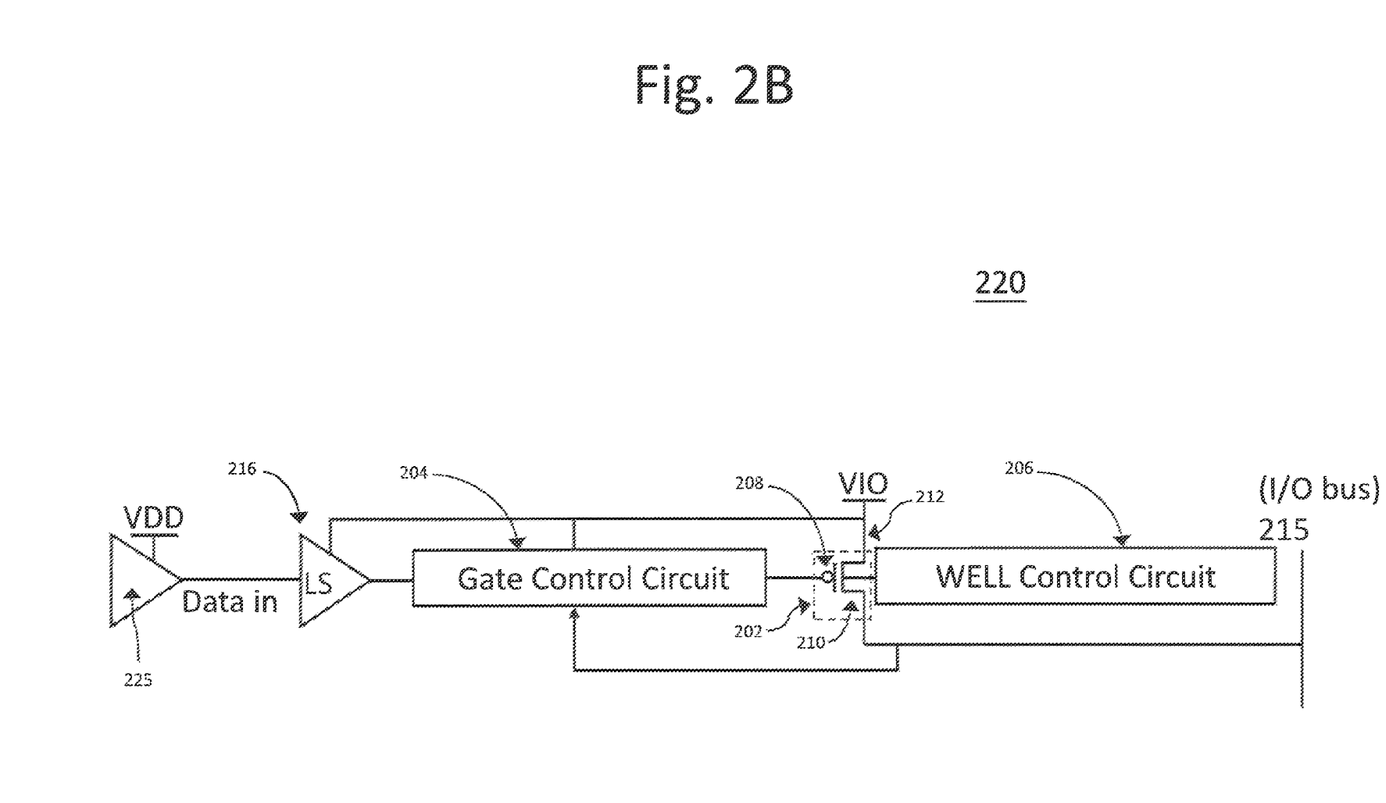
FIG. 2B is a schematic of an alternate configuration of an output buffer circuit implemented in a VIO mode according to an exemplary embodiment.

FIG. 2B illustrates an alternate configuration of an exemplary output buffer circuit 220. Elements of the output buffer circuit 220 that are the same as those of the output buffer circuit 200 are identified by the same reference numerals and their descriptions are not repeated. The source terminal 212 of output buffer circuit 220 receives a voltage VIO. The voltage VIO is the operating voltage of the output buffer circuit 220. The voltage VIO can be different from the internal circuit operating voltage VDD. The source terminal 212 is coupled to the gate control circuit 204 and a Level Shift circuit (LS) 216. The Level Shift circuit 216 receives a data signal having a level of the internal circuit operating voltage VDD and changes the level from VDD to VIO so that VIO provides the data signal to the external I/O bus 215. In this manner, the internal circuit operating voltage VDD is isolated from the output buffer operating voltage VIO. In one embodiment, the Level Shift circuit 216 reduces the voltage of the data signal, which serves to reduce power consumption of the external I/O bus 215 when VDD>VIO.

The circuits of the embodiments described with respect to FIGS. 3-7 have a configuration similar to the output buffer circuit 200 of FIG. 2A, in which only the internal circuit operating voltage VDD is provided to the pMOS transistor 202, the gate control circuit 204, and the well control circuit 206 of the output buffer circuit 200. However, a person of ordinary skill in the art will now appreciate that the circuits of the embodiments described with respect to FIGS. 3-7 can have a configuration similar to FIG. 2B, in which the internal circuit operating voltage VDD is first shifted by the level shift circuit 216 to become VIO, and VIO is provided, instead of VDD, to the pMOS transistor 202, the gate control circuit 204, and the well control circuit 206 of the output buffer circuit 220. When the circuits of the embodiments described with respect to FIGS. 3-7 have a configuration similar to FIG. 2B, VDD and VIO are both shut down when the device is powered down (i.e., in power down mode).

The driving source of the external I/O bus 215 changes dynamically. Sometimes the external I/O bus 215 is driven by the output from pMOS transistor 202. Sometimes the external I/O bus 215 is driven by the output from other chips coupled to the external I/O bus 215. Sometimes the external I/O bus 215 is not driven at all, i.e., the external I/O bus 215 is floating. Regardless of the driving source of the external I/O bus 215, there is always a voltage having a finite voltage level, which could be zero, on the external I/O bus 215. Hereinafter, the voltage that is present on the external I/O bus 215 is referred to as a "bus voltage."

Referring again to FIG. 2A, the output buffer circuit 200 is configured to prevent back flow of current into the chip from the external I/O bus 215 when the chip is powered down. The drain terminal 210 of the pMOS transistor 202 is coupled to the external I/O bus 215 to provide the bus voltage of the external I/O bus 215 to the drain terminal 210 of the pMOS transistor 202. The external I/O bus 215 is also coupled to the gate control circuit 204. The gate control circuit 204 operates in response to the bus voltage of the external I/O bus 215. An exemplary configuration of the gate control circuit 204 is described below. The well control circuit 206, which is coupled to well terminal 214 of pMOS transistor 202, maintains a voltage on the well terminal 214 not less than the greater of a first voltage and a second voltage to prevent leakage current in the pMOS transistor 202. The first voltage is the internal circuit operating voltage VDD minus D1, where D1 is a positive value or zero. The second voltage is the bus voltage of the external I/O bus 215 minus D2, where D2 is a positive value or zero. D1 and D2 can be equal to each other or different from each other. In this configuration, the pMOS transistor 202 can be turned off completely when the chip is powered down (VDD=0) and when the chip is powered on (VDD=1.8V). Thus, turning off the pMOS transistor 202 and maintaining the well voltage prevents current back flow.

Referring to FIG. 2B, the output buffer circuit 220 is configured to prevent current backflow into the chip from the external I/O bus 215 when the chip is powered down and to convert the circuit operating voltage VDD of the chip to the voltage of the external I/O bus 215. The drain terminal 210 of the pMOS transistor 202 is coupled to the external I/O bus 215 to provide the bus voltage of the external I/O bus 215 to the drain terminal 210 of the pMOS transistor 202. The external I/O bus 215 is coupled to the gate control circuit 204. The gate control circuit 204 operates in response to the voltage present on the bus voltage of the external I/O bus 215. The well control circuit 206, which is coupled to well terminal 214 of pMOS transistor 202, maintains a voltage on the well terminal 214 not less than the greater of the second voltage and a third voltage to prevent leakage current in the pMOS transistor 202. The second voltage is the voltage of the external I/O bus 215 minus D2, where D2 is a positive value or zero. The third voltage is the operating voltage VIO of the output buffer circuit 220 minus D3, where D3 is a positive value or zero. D2 and D3 can be equal to each other or different from each other. In addition, the Level Shift circuit 216 of the output buffer circuit 220 reduces the voltage of the data signal VDD to the I/O voltage of VIO to reduce the voltage on the external I/O bus 215. In this manner, the output buffer circuit 220 both prevents current backflow from the external I/O bus 215 in power down mode and isolates the internal circuit operating voltage VDD from the output buffer operating voltage VIO in power up mode.

Figure 3:
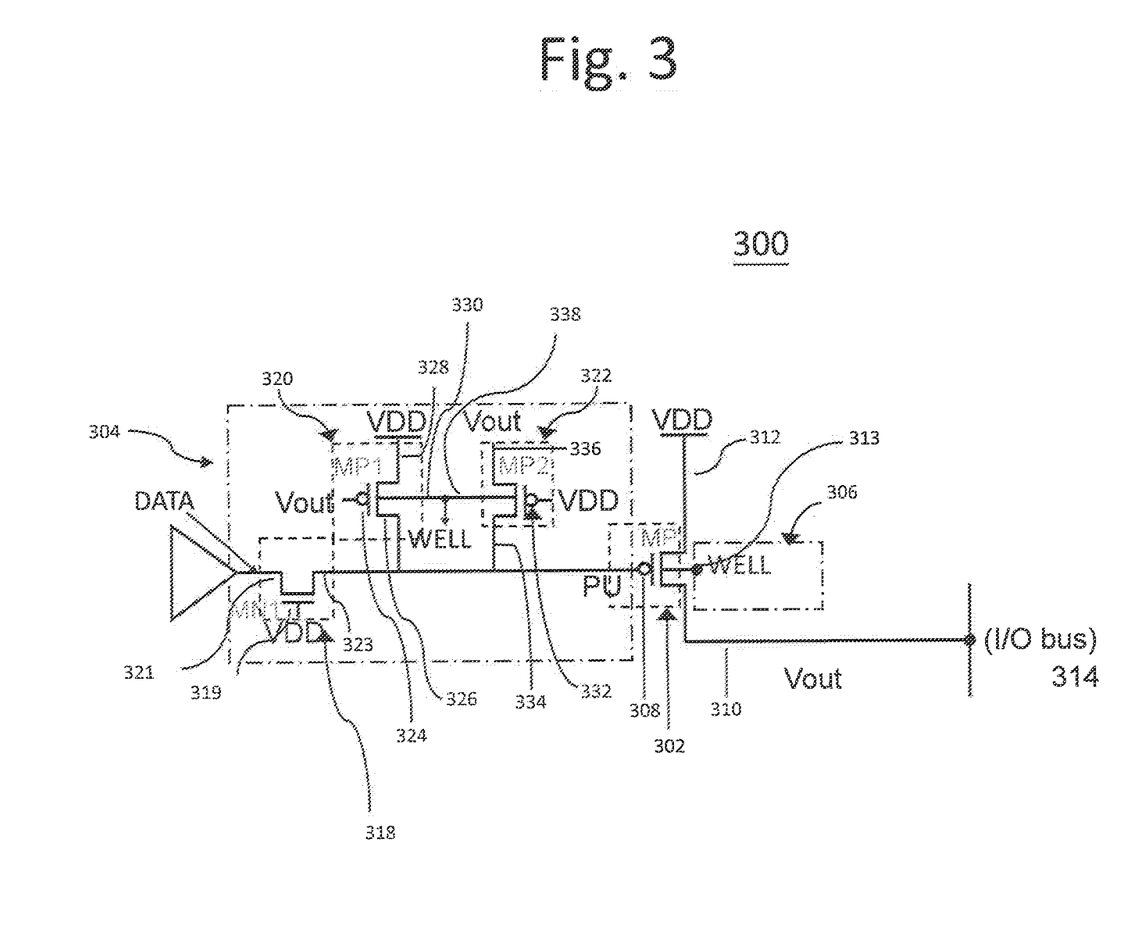
FIG. 3 is an exemplary circuit diagram of the first embodiment.

FIG. 3 is an exemplary circuit diagram of an output buffer circuit 300 of the previously mentioned embodiment. The output buffer circuit 300 is an exemplary implementation of output buffer circuit 200. Referring to FIG. 3, the output buffer circuit 300 includes an output switch, for example, a pMOS transistor MP 302, a gate control circuit 304, and a well control circuit 306. The pMOS transistor MP 302, gate control circuit 304, and well control circuit 306 correspond to the pMOS transistor 202, gate control circuit 204, and well control circuit 206 of the output buffer circuit 200 (FIG. 2A), respectively. The pMOS transistor MP 302 includes a Pull-Up (PU) gate terminal 308, a drain terminal 310, a source terminal 312, and a well terminal 313. The drain terminal 310 is coupled to an external I/O bus 314, having a bus voltage Vout. The PU gate terminal 308, drain terminal 310, source terminal 312, and well terminal 313 of pMOS transistor MP 302 correspond to the gate terminal 208, drain terminal 210, source terminal 212, and well terminal 214 of pMOS transistor 202 (FIG. 2A), respectively. The source terminal 312 is coupled to receive VDD. The gate control circuit 304 is coupled to the PU gate terminal 308 of the pMOS transistor 302. The gate control circuit 304 includes an input switch to prevent current backflow into the chip, for example, an nMOS transistor MN1 318, a first pMOS transistor MP1 320, and a second pMOS transistor MP2 322 coupled to the PU gate terminal 308 of pMOS transistor MP 302. The nMOS transistor MN1 318 includes a gate terminal 319, a drain terminal 321, and a source terminal 323. The gate terminal 319 is coupled to receive VDD. The drain terminal 321 is coupled to receive a Data signal of 0 or 1. The first pMOS transistor MP1 320 includes a gate terminal 324, a drain terminal 326, a source terminal 328, and a well terminal 330. The gate terminal 324 is coupled to receive the bus voltage Vout. The drain terminal 326 is coupled to the PU gate terminal 308 of pMOS transistor MP 302 and the source terminal 323 of the nMOS transistor MN1 318. The source terminal 328 of first pMOS transistor MP1 320 is coupled to receive voltage VDD. The second pMOS transistor 322 includes a gate terminal 332, a drain terminal 334, a source terminal 336, and a well terminal 338. The gate terminal 332 is coupled to receive VDD. The drain terminal 334 is coupled to the PU gate terminal 308 of pMOS transistor MP 302, the drain terminal 326 of first pMOS transistor MP1 320, and the source terminal 323 of the nMOS transistor MN1 318. The source terminal 336 of the second pMOS transistor MP2 322 is coupled to receive the bus voltage Vout. The well terminals 330 and 338 of the first pMOS transistor MP1 320 and second pMOS transistor MP2 322, respectively, are coupled together. The well control circuit 306 is coupled to well terminal 313 of the pMOS transistor MP 302. The well terminals 330 and 338 of the first pMOS transistor MP1 and second pMOS transistor MP2 are also coupled to the well control circuit 306. In some embodiments, the well terminal 313 of the pMOS transistor 302 and the well terminals 330 and 338 of first pMOS transistor MP1 320 and second pMOS transistor MP2 322, respectively, can be coupled to separate well control circuits. Exemplary constructions of the well control circuit 306 are described below.

Figure 4A:
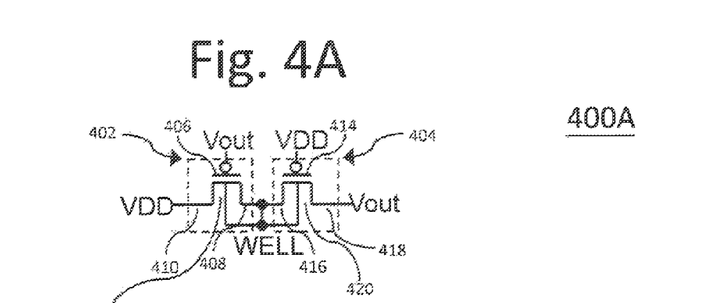
FIGS. 4A-4C are circuit diagrams of a well control element according to exemplary embodiments.
Figure 4B:
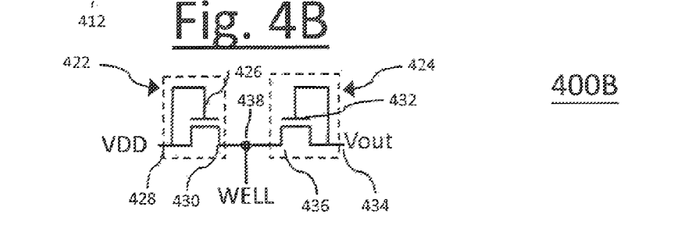
Figure 4C:
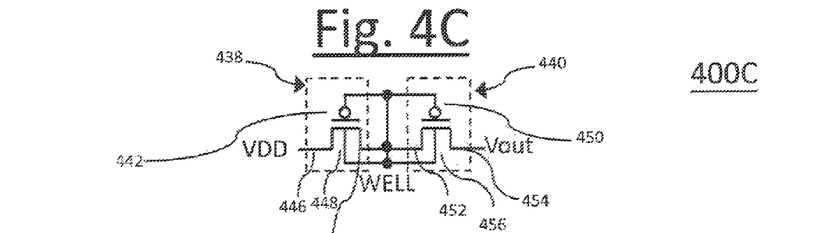

As shown in FIGS. 2A and 2B, the well control circuit 206 is coupled to control the voltage of the well terminal 214 of the pMOS transistor 202. In FIG. 3, the well control circuit is coupled to control the voltage of the well terminals 313, 330, and 338 of the pMOS transistors 302, 320, and 322, respectively. FIGS. 4A-4C illustrate circuit diagrams of exemplary well control circuits 400A-400C, respectively. In FIGS. 4A-4C, each exemplary well control circuit is configured to control the voltage of the well terminal so that the pMOS transistors to which the well control circuit is coupled can be effectively turned off when appropriate. In order to effectively turn off each such pMOS transistor, when the gate terminal of the pMOS transistor receives voltage VDD, the well voltage should be no less than the maximum of the voltage at the drain terminal and the source terminal. If the well voltage is less than the maximum of the voltage at the drain terminal and the source terminal, the pMOS transistor may generate leakage current.

With reference to FIG. 4A, the well control circuit 400A includes a first pMOS transistor 402 and a second pMOS transistor 404 coupled in series. The first pMOS transistor includes a gate terminal 406, a drain terminal 408, a source terminal 410, and a well terminal 412. The second pMOS transistor 404 includes a gate terminal 414, a drain terminal 416, a source terminal 418, and a well terminal 420. The gate terminal 406 of the first pMOS transistor 402 is coupled to receive the bus voltage Vout. The drain terminal 408 of the first pMOS transistor 402 is coupled to the drain terminal 416 of the second pMOS transistor 404. The source terminal 410 is coupled to receive VDD. The well terminal 412 of the first pMOS transistor 402 is coupled to the well terminal of 420 of the second pMOS transistor 404 and to the drain terminals 408 and 416. The gate terminal 414 of the second pMOS transistor 404 is coupled to receive VDD and the source terminal 418 is coupled to receive Vout.

For convenience of description herein, when VDD is high, VDD is provided at the circuit operating voltage (e.g., 1.8V or 3.0V). When VDD is low, it is provided at 0V. Similarly, when Vout is high, Vout is provided at VDD or VIO, the circuit operating voltage or the reduced voltage provided by, e.g., the level shift circuit 216, respectively. When Vout is low, the voltage provided is 0V.

During operation of well control circuit 400A, when VDD and Vout are high, the voltage at the well terminals 412 and 420 is VDD−Vdiode, where Vdiode is the voltage to turn on the PN junctions formed in the source and drain of each pMOS transistor 402, 404. When Vout is low and VDD is high, the voltage at the well terminals 412 and 420 is VDD. When Vout is high and VDD is low, the voltage at the well terminals 412 and 420 is Vout. When Vout and VDD are both low, the voltage at the well terminals 412 and 420 is floating ground, which is high relative to low Vout and low VDD. In this configuration, when VDD≠Vout, the pMOS transistors to which the well control circuit is coupled, e.g., pMOS transistors 202, 302, 320, and 322, do not experience leakage current and can therefore completely turn off. When VDD=Vout, the well voltage is VDD−Vdiode, which is large enough to suppress leakage current.

Referring to FIG. 4B, the well control circuit 400B includes a first nMOS transistor 422 and a second nMOS 424 transistor, coupled in series. The first nMOS transistor 422 includes a gate terminal 426, a drain terminal 428, and a source terminal 430. The second nMOS transistor 424 includes a gate terminal 432, a drain terminal 434, and a source terminal 436. The gate terminals 426 and 432 are coupled to the drain terminals 428 and 434, respectively. The source terminals 430 and 436 are coupled together and to a well terminal 438. The drain terminal 428 of first nMOS transistor 422 is coupled to receive VDD and the drain terminal 434 of second nMOS 424 is coupled to receive Vout.

During operation of well control circuit 400B, when VDD and Vout are high, the voltage at the well terminal 438 is equal to the greater of VDD minus a threshold voltage Vt422 of first nMOS transistor 422, i.e., VDD−Vt422, and VDD minus a threshold voltage Vt424 of second nMOS transistor 424, i.e., VDD−Vt424. The voltage drop of Vtn across first nMOS transistor 422 or second nMOS transistor 424 results when current passes through first nMOS transistor 422 or second nMOS transistor 424, resulting in well voltage VDD−Vtn. When Vout is low and VDD is high, the voltage at the source terminals 430 and 436 is VDD−Vt422. When Vout is high and VDD is low, the voltage at the source terminals 430 and 436 is VDD−Vt424. When Vout and VDD are both low, the voltage at the source terminals 430 and 436 is floating ground, which is higher than low Vout and low VDD. In this configuration, when VDD=Vout, the pMOS transistors to which the well control circuit is coupled, e.g., pMOS transistors 202, 302, 320, and 322, do not experience leakage current and can therefore completely turn off. When VDD≠Vout, the well voltage is VDD−Vtn, which is large enough to suppress leakage current.

Referring to FIG. 4C, the well control circuit 400C includes a first pMOS transistor 438 and a second pMOS transistor 440 coupled in series. The first pMOS transistor 438 includes a gate terminal 442, a drain terminal 444, a source terminal 446, and a well terminal 448. The second pMOS transistor 440 includes a gate terminal 450, a drain terminal 452, a source terminal 454, and a well terminal 456. The drain terminal 444 of the first pMOS transistor 438 is coupled to the drain terminal 452 of the second pMOS transistor 440. The gate terminals 442 and 450 of first pMOS transistor 438 and second pMOS transistor 440, respectively, are coupled to each other, to the drain terminals 444 and 452, and to the well terminals 448 and 456. The source terminal 446 of first pMOS transistor 438 is coupled to receive VDD and the source terminal 454 of second pMOS transistor 440 is coupled to receive Vout.

During operation of well control circuit 400C, when VDD and Vout are high, the voltage at the drain terminals 428 and 434 is the higher of VDD−Vtp or VDD−Vdiode. A voltage drop equal to a threshold voltage of first pMOS transistor 438 and second pMOS transistor 440, Vtp, results when current passes through first pMOS transistor 438 and second nMOS transistor 440, resulting in well voltage VDD−Vtp. When Vout is low and VDD is high, the voltage at the drain terminals 444 and 454 is the higher of VDD−Vtp or VDD−Vdiode. When Vout is high and VDD is low, the voltage at the source terminals 444 and 454 is the higher of VDD−Vtp or VDD−Vdiode. When Vout and VDD are both low, the voltage at the source terminals 444 and 454 is floating ground, which is high relative to low Vout and low VDD. In this configuration, when VDD=Vout, the pMOS transistors to which the well control circuit is coupled, e.g., pMOS transistors 202, 302, 320, and 322, do not experience leakage current and can therefore completely turn off. When VDD≠Vout, the well voltage is VDD−Vtp or VDD−Vdiode, which is large enough to suppress leakage current.

Figure 5A:
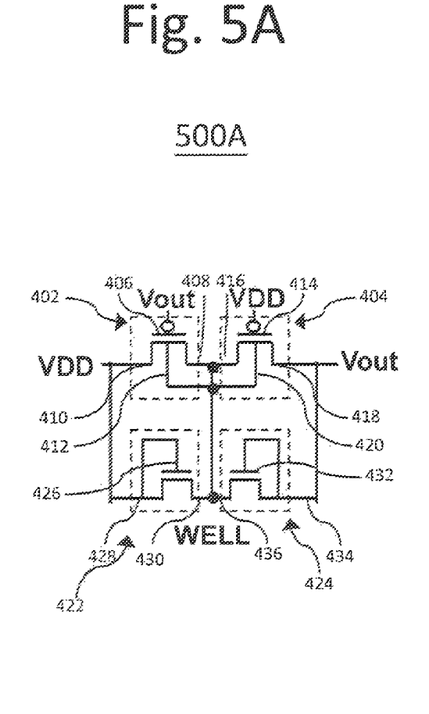
FIGS. 5A-5B are schematics of alternative configurations of the well control element according to exemplary embodiments.
Figure 5B:
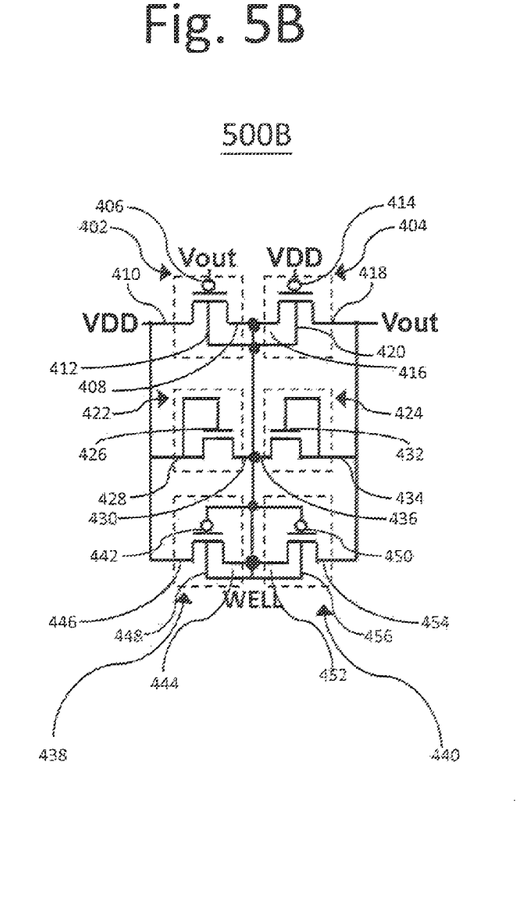

FIGS. 5A and 5B are schematics of several alternative configurations of the well control circuit 206 or 306. FIGS. 5A and 5B illustrate several parallel combinations of the well control circuits 400A, 400B, and 400C. Configuring the well control circuits 400A, 400B, and 4000 (FIGS. 4A-4C) in parallel allows for control of the well voltage both when VDD=Vout and when VDD≠Vout. FIG. 5A illustrates a well control circuit 500A formed by coupling well control circuits 400A and 400B in parallel. The drain terminal 428 of first nMOS transistor 422 is coupled to the source terminal 410 of the first pMOS transistor 402. The drain terminal 434 of the second nMOS transistor 424 is coupled to the source terminal 418 of second pMOS transistor 524. The source terminal 430 of the first nMOS transistor 422 is coupled to the source terminal 436 of the second nMOS transistor 424, which are in turn coupled to the drain terminal 408 and the well terminal 412 of first pMOS transistor 402 and the drain terminal 416 and the well terminal 420 and of second pMOS transistor 404.

FIG. 5B illustrates a well control circuit 500B formed by coupling well control circuits 400A, 400B, and 400C in parallel. The drain terminal 428 of the first nMOS transistor 422 is coupled to the source terminal 410 of the first pMOS transistor 402. The drain terminal 434 of the second nMOS transistor 424 is coupled to the source terminal 418 of the second pMOS transistor 404. The source terminal 430 of the first nMOS transistor 422 is coupled to the source terminal 436 of the second nMOS transistor 424, which in turn are coupled to the drain terminal 408 and the well terminal 412 of first pMOS transistor 402 and the drain terminal 416 and the well terminal 420 and of second pMOS transistor 404. The gate terminal 442 of the first pMOS transistor 438 and the gate terminal 450 of the second pMOS transistor 440 are coupled to the well terminals 448 and 456 and the drain terminals 444 and 452 of the first pMOS transistor 438 and the second pMOS transistor 440, respectively, the source terminal 430 of the first nMOS transistor 422 and the source terminal 436 of the second nMOS transistor 424 and to the drain terminals 408 and 416 and well terminals 412 and 420 of the first pMOS transistor 402 and the second pMOS transistor 404. The source terminal 446 of the first pMOS transistor 438 is coupled to the drain terminal 428 of the first nMOS transistor 422 and the source terminal 410 of the first pMOS transistor 402. The source terminal 454 of the second pMOS transistor 440 is coupled to the drain terminal 434 of the second nMOS transistor 424 and the source terminal 418 of the second pMOS transistor 404.

Referring again to FIG. 3, in exemplary embodiments, the output buffer circuit 300 is configured to prevent the back flow of current into a chip when the chip is powered down. Several different operating cases for the output buffer circuit 300 are considered next. In a first case, the circuit operating voltage VDD is 1.8V, a data signal (Data) is 1.8V, and the voltage Vout on the I/O bus 314 is 1.8V. In this case, when a bus voltage Vout on the external I/O bus 314 is 1.8V, the well control circuit 306 maintains a voltage of 1.8V at the well terminal 313 of pMOS transistor MP 302 and well terminals 330 and 338 of the first pMOS transistor MP1 320 and second pMOS transistor MP2 322, respectively, of the gate control circuit 304. The first pMOS transistor MP1 320 and the second pMOS transistor MP2 322 are both turned off so that neither VDD nor Vout provided at their source terminals 328 and 336, respectively, is applied to drain terminals 326 and 334, respectively. Therefore, neither VDD nor Vout at the source terminals 328 and 336 is applied to PU gate terminal 308. Instead, gate terminal PU 308 receives the data signal VDD minus a threshold voltage Vtn of nMOS transistor MN1 318, VDD−Vtn. Because VDD−Vtn is less than the greater of the circuit operating voltage VDD and Vout, the pMOS transistor MP 302 may suffer leakage current. However, this leakage will terminate over time. In this manner, the pMOS transistor MP 302 is turned off.

In a second case, the circuit operating voltage VDD is 1.8V, a data signal (Data) is 1.8V, and the voltage Vout on the I/O bus 314 is 0V. In this case, when voltage Vout on the external I/O bus 314 is 0V, the first pMOS transistor MP1 320 turns on because the voltage at the gate terminal 324 is 0V, allowing the PU gate terminal 308 to receive voltage VDD from the source terminal 328 of first pMOS transistor MP1 320. The second pMOS transistor MP2 322 is off, so that Vout at the source terminal 336 does not reach the drain terminal 334 and is not received by the PU gate terminal 308 of pMOS transistor MP 302. Therefore, after passing through nMOS transistor MN1 318, the Data signal VDD drops by the threshold voltage of nMOS transistor 318 Vtn, to VDD−Vtn but is then charged up to VDD as a result of VDD being received from the source terminal 328 of first pMOS transistor MP1 320. When PU gate terminal 308 of pMOS transistor 302 receives VDD, it turns off.

In a third case, the circuit operating voltage VDD is 1.8V, a data signal (Data) is 0V, and the voltage Vout on the I/O bus 314 increases from 0V to 1.8V. In this case, when the bus voltage Vout on the external I/O bus is 0V, the voltage applied at the PU gate terminal 308 of pMOS transistor MP 302 is 0V. Second pMOS transistor MP2 322 is turned off. First pMOS transistor MP1 320 is initially turned on when Vout equals 0V. As a result, voltage VDD at source terminal 328 of first pMOS transistor MP1 320 "conflicts" with the data signal of 0V received by nMOS transistor MN1 318. However, the pMOS transistor MP1 320 is selected to be smaller, having lower drive current, than nMOS transistor MN1 318, ensuring that the voltage received by PU gate terminal 308 is the data signal of 0V from nMOS transistor MN1 318. After Vout increases to 1.8V, first pMOS transistor MP1 320 turns off, and a voltage of 0V is received by PU gate terminal 308, which turns on pMOS transistor MP 302. VDD at source terminal 312 of pMOS MP 302 is then applied to the external I/O bus 314.

Thus, in the exemplary embodiment of FIG. 3, when VDD is 1.8V and the Data signal is 1.8V, the pMOS transistor MP 302 turns off. When VDD is 1.8V and the Data signal is 0V, the pMOS transistor MP 302 turns on. In this manner, when the chip is on (VDD is 1.8V), the high Data signal turns off pMOS transistor MP 302 to prevent current back flow. The well control circuit 306 maintains a well voltage that suppresses leakage current and allows for turning off the pMOS transistors.

In a fourth case, the circuit operating voltage VDD is 0V and the voltage Vout on the I/O bus 314 is 1.8V. In this case, when the bus voltage Vout is 1.8V, the well terminal 313 receives Vout of 1.8V from the well control circuit 306. The well terminals 330 and 338 of the first and second pMOS transistors 320 and 322, respectively, of the gate control circuit 304 also receive Vout of 1.8V. The first pMOS transistor 320 MP1 is off because its gate terminal 324 receives Vout of 1.8V. The second pMOS transistor 322 MP2, which is larger than MP1 to provide higher drivability, e.g., MP1 has a larger width/length ratio than MP2, is on because its gate terminal 332 receives VDD, which is 0V. Therefore, Vout of 1.8V, from the source terminal 336 of pMOS transistor 322, is applied at the PU gate terminal 308 of the pMOS transistor MP 302. The Vout of 1.8V at the PU gate terminal 308 causes the pMOS transistor MP 302 to turn off, preventing current from flowing from the external I/O bus 314 into the output buffer circuit 300.

In a fifth case, the circuit operating voltage VDD is 0V and the voltage Vout on the I/O bus 314 is 0V. In this case, when the bus voltage Vout is 0V, VDD equals 0. Applying Vout of 0V to the gate terminal 324 of the first pMOS transistor MP1 320 and a VDD of 0V to the gate terminal 332 of the second pMOS transistor MP2 322 turns on both transistors. The second pMOS transistor MP2 322 is large enough to allow the voltage at PU gate terminal 308 to track Vout. PU gate terminal 308 receives VDD from source terminal 328 and Vout from source terminal 336. In this instance, the PU gate terminal 308, drain terminal 310, and source terminal 312 of the pMOS transistor MP 302 are at 0V. Well terminal 313 is at floating ground, which is higher than 0V. Therefore, pMOS transistor MP 302 is turned off and leakage current is prevented from flowing in the pMOS transistor MP 302. In addition, nMOS transistor MN1 318 prevents current backflow when the chip is powered down because the nMOS transistor MN1 318 will be turned off when VDD is low.

Therefore, in the exemplary embodiment of FIG. 3, when VDD is 0V and Vout is 1.8V, pMOS transistor MP 302 is off. Similarly, when VDD is 0V and Vout is 0V, pMOS transistor MP 302 is off. In this manner, when the chip is powered down, the well control circuit 306 maintains a well voltage to suppress leakage current and allows for turning off the pMOS transistors.

Figure 6:
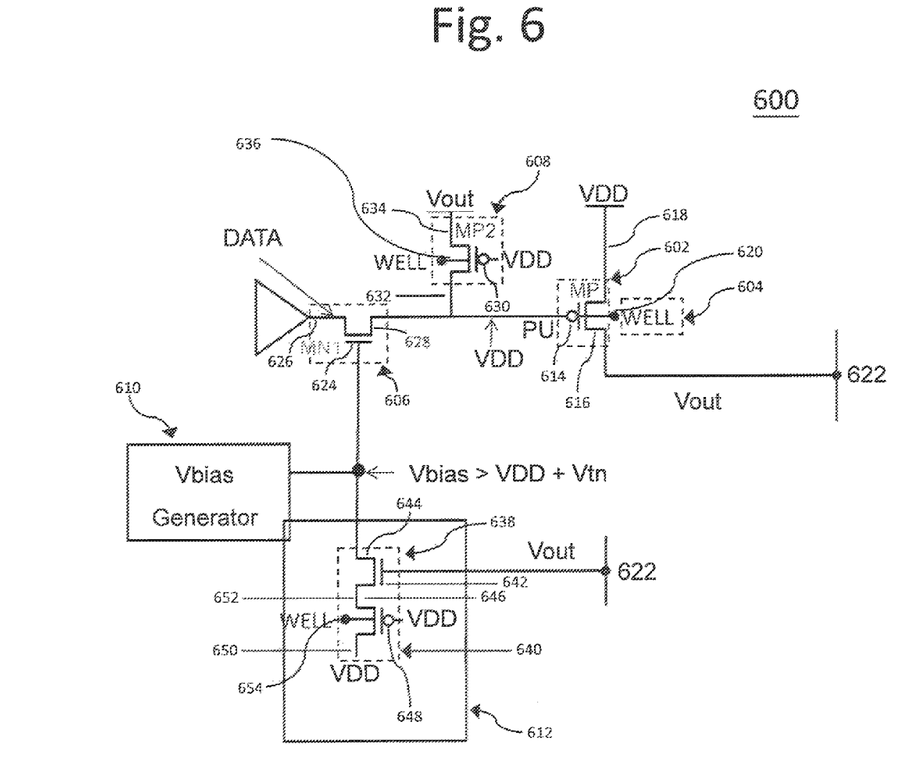
FIG. 6 is a circuit diagram of the configuration according to an exemplary embodiment.

In an exemplary embodiment, an output buffer circuit 600, shown in FIG. 6, is configured to allow a data signal Data to reach an output switch 602 without dropping in voltage. Referring to FIG. 6, the output buffer circuit 600 includes an output switch, for example, a pMOS transistor MP 602, a well control circuit 604, an input switch, for example, an nMOS transistor MN1 606, a gate control circuit, for example, a pMOS transistor MP2 608, a bias voltage generator 610, and a voltage discharging circuit 612. The pMOS transistor MP 602 includes a PU gate terminal 614, a drain terminal 616, a source terminal 618, and a well terminal 620. The drain terminal 616 of pMOS transistor MP 602 is coupled to an external I/O bus 622. The source terminal 618 receives the circuit operating voltage VDD. The well control circuit 604 is coupled to the well terminal 620 of the pMOS transistor MP 602. The well control circuit 604 can be configured in any of the ways depicted in FIGS. 4A-4C and FIGS. 5A and 5B.

The nMOS transistor MN1 606 is coupled to the PU gate terminal 614 of pMOS transistor MP 602. The nMOS transistor MN1 606 includes a gate terminal 624, a drain terminal 626, and a source terminal 628. The pMOS transistor MP2 608 includes a gate terminal 630, a drain terminal 632, a source terminal 634, and a well terminal 636. The drain terminal 632 of pMOS transistor MP2 608 is coupled to the PU gate terminal 614 of pMOS transistor MP 602 and to the source terminal 628 of nMOS transistor MN1 606. The source terminal 634 is coupled to receive Vout. The well terminal 636 of pMOS transistor MP2 608 is coupled to well control circuit 604. In some embodiments, the well terminal 636 of pMOS transistor MP2 608 and the well terminal 620 of the pMOS transistor MP 602 are coupled to separate well control circuits.

Voltage discharging circuit 612 includes an nMOS transistor 638 and a pMOS transistor 640 coupled in series. The nMOS transistor 638 includes a gate terminal 642, a drain terminal 644, and a source terminal 646. The gate terminal 642 is coupled to the external I/O bus 622 and receives Vout. The pMOS transistor 640 includes a gate terminal 648, a drain terminal 650, a source terminal 652, and a well terminal 654. The gate terminal 648 and drain terminal 650 are coupled to receive the circuit operating voltage VDD. Voltage discharging circuit 612 is coupled to bias voltage generator 610 and gate terminal 624 of the nMOS transistor MN1 606. The well terminal 620 of pMOS transistor MP 602, the well terminal 636 of pMOS transistor MP2 608, and the well terminal 654 of pMOS transistor 640 are coupled to well control circuit 604. In some embodiments, the well terminals 620 of pMOS transistor MP 602, the well terminal 636 of pMOS transistor MP2 608, and the well terminal 654 of pMOS transistor 640 are coupled to separate well control circuits.

In exemplary embodiments, the output buffer circuit 600 (FIG. 6) prevents the back flow of current into the chip when the chip is powered down. Referring to FIG. 6, when the chip is powered down VDD is 0V. When the bus voltage Vout on the external I/O bus 622 is 1.8V, Vout is applied to the drain terminal 616 of the pMOS transistor 602 and to the source terminal 634 of pMOS transistor MP2 608. VDD at the gate terminal of pMOS transistor MP2 608 is 0V so that pMOS transistor MP2 608 turns on and Vout at the source terminal 634 is applied to the PU gate terminal 614 of pMOS transistor 602. The Vout applied to the PU gate terminal 614 turns off the pMOS transistor MP 602. Therefore, current from the external I/O bus 622 cannot flow into the output buffer circuit. Similarly, when the bus voltage Vout on the external I/O bus 622 is low (for example, 0V) and the chip is powered down, VDD equals 0V. Applying VDD of 0V to the gate terminal 630 turns on the pMOS transistor MP2 608, so that the voltage at the source terminal 634 of pMOS transistor MP2 608 is applied at the PU gate terminal 614 of pMOS transistor MP 602. In this instance, the voltages at the gate terminal 614, drain terminal 616, and source terminal 616 of the pMOS transistor MP 602 are equal to 0V. The well terminal 620 is at floating ground. Since the voltage at the well terminal 620 (floating ground), received from well control circuit 604, is higher than the voltage at the drain terminal 616 and source terminal 618, leakage current through the pMOS transistor 602 is prevented. Therefore, no current from the external I/O bus 622 flows into the output buffer circuit 600. In addition, nMOS transistor MN1 606 prevents current backflow into the chip when the chip is powered down because the nMOS transistor MN1 606 is turned off when VDD is 0V. On the other hand, when VDD is 1.8V, the bias voltage generator 610 supplies a bias voltage Vbias greater than the sum of VDD and the threshold voltage, Vtn, of nMOS transistor 606. This allows the full data signal (VDD) to pass through nMOS transistor 606 without any voltage drop. The voltage discharging circuit 612 includes the nMOS transistor 638 and the pMOS transistor 640 coupled in series to discharge voltage when the voltage of the bias voltage generator 610 drops as the chip is powered down.

Figure 7:
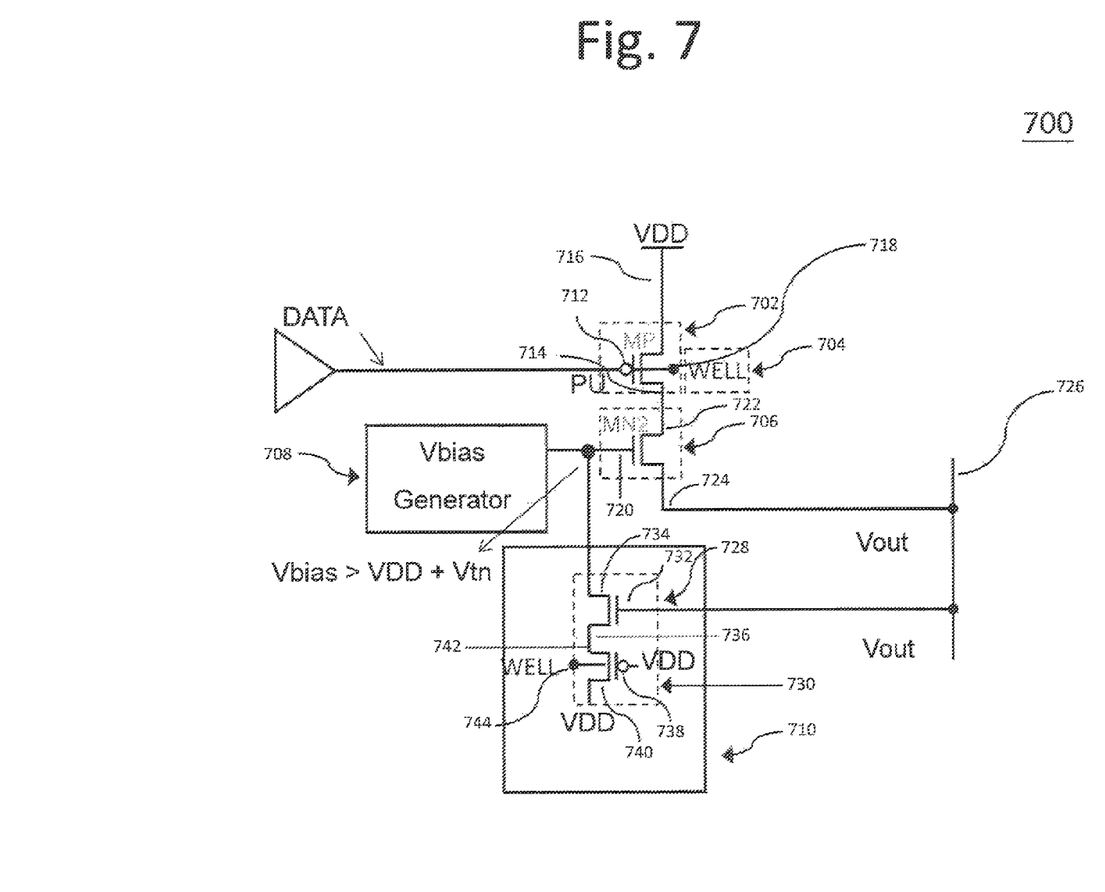
FIG. 7 is a circuit diagram of the configuration according to an exemplary embodiment.

In an exemplary embodiment, an output buffer circuit 700, shown in FIG. 7, is configured to prevent current flow from the external I/O bus into the chip. Referring to FIG. 7, the output buffer circuit 700 includes an output switch, for example, a pMOS transistor MP 702, a well control circuit 704, an input switch, for example, an nMOS transistor MN2 706, a bias voltage generator 708, and a voltage discharging circuit 710. The pMOS transistor MP 702 includes a PU gate terminal 712, a drain terminal 714, a source terminal 716, and a well terminal 718. The source terminal 716 is coupled to receive the circuit operating voltage VDD. Well control circuit 704 is coupled to the well terminal 718. Well control circuit 704 can be configured in any of the ways depicted in FIGS. 4A-4C and FIGS. 5A and 5B. The nMOS transistor MN2 706 includes a gate terminal 720, a drain terminal 722, and a source terminal 724. The nMOS transistor MN2 706 is coupled between the drain terminal 714 of pMOS transistor MP 702 and an external I/O bus 726. The bias voltage generator 708 is coupled to the gate terminal 720 of the nMOS transistor MN2 706. The voltage discharging circuit 710 includes an nMOS transistor 728 and a pMOS transistor 730 coupled in series. The nMOS transistor 728 includes a gate terminal 732, a drain terminal 734, and a source terminal 736. The gate terminal 732 is coupled to the external I/O bus 726. The pMOS transistor 730 includes a gate terminal 738, a drain terminal 740, a source terminal 742, and a well terminal 744. The gate terminal 738 and the source terminal 742 receive VDD. The well terminal 744 of pMOS transistor 730 and the well terminal 718 of pMOS transistor 702 are coupled to well control circuit 704. The well control circuit 704 may be configured as described in reference to FIGS. 4A-4C and FIGS. 5A and 5B. The voltage discharging circuit 710 is coupled to the bias voltage generator 708 and the gate terminal 720 of nMOS transistor 706.

In exemplary embodiments, the output buffer circuit 700 prevents the back flow of current into the chip when the chip is powered down. Referring to FIG. 7, when the chip is powered down, VDD is 0V. The well control circuit 704 prevents leakage current in the pMOS transistors and allows for turning off the pMOS transistors 702, 730. When the bus voltage Vout on the external I/O bus 726 is 1.8V, it is applied to the source terminal 724 of the nMOS transistor MN2 706. The bias voltage generator 708 is turned off when the chip is powered down. Therefore, the voltage at gate terminal 720 of the nMOS transistor MN2 706 is 0V, so that the nMOS transistor 706 MN2 is off. Therefore, current from the external I/O bus 726 cannot flow into the output buffer circuit. When the voltage on the external I/O bus 726 is 0V and the chip is powered down, the nMOS transistor MN2 706 is turned off. Therefore, current cannot flow from the external I/O bus 726 into the output buffer circuit 700. When the chip is on (VDD is 1.8V), the bias voltage generator 708 supplies a bias voltage Vbias greater than the sum of VDD and a threshold voltage (Vtn) of nMOS transistor 706. This allows the full voltage from external I/O bus 726 to pass through nMOS transistor MN2 706 without loss in voltage. The voltage discharging circuit 710 includes nMOS and pMOS transistors 728 and 730, respectively, in series, to discharge voltage when the bias voltage generator 708 drops in voltage as the chip is powered down.

Other embodiments of the invention will be apparent to those skilled in the art from consideration of the specification and practice of the invention disclosed herein. This application is intended to cover any variations, uses, or adaptations of the invention following general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. An output circuit, comprising:
   an output switch including a gate terminal, a drain terminal coupled to an external I/O bus, and a well terminal;
   a well control circuit, having a well terminal coupled to the well terminal of the output switch, to maintain a well voltage of the output switch at a level not less than a greater of a first voltage and a second voltage; and
   a gate control circuit coupled to the gate terminal and the drain terminal of the output switch and to the external I/O bus, and operable to turn off the output switch, to prevent current flow through the output switch from the external I/O bus when:
      an operating voltage of the output circuit is not applied to the output switch, and
      a bus voltage from an external device is present on the external I/O bus.

2. The circuit of claim 1, where in the output switch is configured to, when on, supply a data signal to the external data bus.

3. The circuit of claim 1, wherein
   the first voltage is an operating voltage of the output circuit minus D1,
   the second voltage is the bus voltage of the external I/O bus minus D2, and
   each one of D1 and D2 is a positive value or zero.

4. The circuit of claim 1, wherein the well control circuit includes:
   a first transistor having a gate terminal for receiving the bus voltage of the external I/O bus, a first source/drain terminal, a second source/drain terminal for receiving the operating voltage of the output circuit, and a well terminal; and
   a second transistor coupled in series with the first transistor and having a gate terminal for receiving the operating voltage of the output circuit, a first source/drain terminal coupled to the first source/drain terminal of the first transistor, a second source/drain terminal for receiving the bus voltage of the external I/O bus, and a well terminal, coupled to the well terminal of the first transistor and the first source/drain terminals of the first and second transistors, to serve as the well terminal of the well control circuit.

5. The circuit of claim 1, wherein the well control circuit includes:
   a first transistor having a gate terminal for receiving the operating voltage of the output circuit, a first source/drain terminal, and a second source/drain terminal coupled to the gate terminal;
   a second transistor having a gate terminal for receiving the bus voltage of the external I/O bus, a first source/drain terminal coupled to the source/drain terminal of the first transistor, and a second source/drain terminal coupled to the gate terminal; and
   a well terminal, coupled to the first source/drain terminals of the first and second transistors, to serve as the well terminal of the well control circuit.

6. The circuit of claim 1, wherein the well control circuit includes:
   a first transistor having a gate terminal, a first source/drain terminal, a second source/drain terminal for receiving the operating voltage of the output circuit, and a well terminal; and
   a second transistor having a gate terminal coupled to the gate terminal of the first transistor and to the first source/drain terminal of the first transistor, a first source/drain terminal coupled to the first drain terminal of the first transistor, a second source/drain terminal for receiving the bus voltage of the external I/O bus, and a well terminal coupled to the well terminal of the first transistor, the first source/drain terminals of the first and second transistors and the gate terminals of the first and second transistors, to serve as the well terminal of the well control circuit.

7. An output circuit, comprising:
   an output switch operable, when on, to supply a data signal to an external I/O bus having a bus voltage, the output switch including a gate terminal, a drain terminal, and a well terminal;
   a well control circuit, having a well terminal coupled to the well terminal of the output switch, to maintain a well voltage of the output switch at a level not less than a greater of a first voltage and a second voltage;
   an input switch coupled to the gate terminal of the output switch;
   a gate control circuit coupled to the gate terminal and the drain terminal of the output switch, the external I/O bus, and the input switch;
   a bias voltage generator, coupled to a gate terminal of the input switch, to maintain a bias voltage greater than a sum of the operating voltage of the output circuit and a threshold voltage of the input switch; and
   a voltage discharging circuit coupled to the bias voltage generator, the well control circuit, and the gate terminal of the input switch to discharge the bias voltage generated by the bias voltage generator when the operating voltage of the output circuit decreases.

8. The circuit of claim 7, wherein
   the first voltage is an operating voltage of the output circuit minus D1, the second voltage is the bus voltage of the external I/O bus minus D2, and each one of D1 and D2 is a positive value or zero.

9. The circuit of claim 7, wherein the well control circuit includes:
a first transistor having a gate terminal for receiving the bus voltage of the external I/O bus, a first source/drain terminal, a second source/drain terminal for receiving the operating voltage of the output circuit, and a well terminal; and
a second transistor coupled in series with the first transistor and having a gate terminal for receiving the operating voltage of the output circuit, a first source/drain terminal coupled to the first source/drain terminal of the first transistor, a second source/drain terminal for receiving the bus voltage of the external I/O bus, and a well terminal, coupled to the well terminal of the first transistor and the first source/drain terminals of the first and second transistors, to serve as the well terminal of the well control circuit.

10. The circuit of claim 7, wherein the well control circuit includes:
a first transistor having a gate terminal for receiving the operating voltage of the output circuit, a first source/drain terminal, and a second source/drain terminal coupled to the gate terminal;
a second transistor having a gate terminal for receiving the bus voltage of the external I/O bus, a first source/drain terminal coupled to the first source/drain terminal of the first transistor, and a second source/drain terminal coupled to the gate terminal; and
a well terminal, coupled to the first source/drain terminals of the first and second transistors, to serve as the well terminal of the well control circuit.

11. The circuit of claim 7, wherein the well control circuit includes:
a first transistor having a gate terminal, a first source/drain terminal, a second source/drain terminal for receiving the operating voltage of the output circuit, and a well terminal; and
a second transistor having a gate terminal coupled to the gate terminal of the first transistor and to the first source/drain terminal of the first transistor, a first source/drain terminal coupled to the first source/drain terminal of the first transistor, a second source/drain terminal for receiving the bus voltage of the external I/O bus, and a well terminal coupled to the well terminal of the first transistor, the first source/drain terminals of the first and second transistors and the gate terminals of the first and second transistors, to serve as the well terminal of the well control circuit.

12. An output circuit, comprising:
an output switch operable, when on, to supply a data signal to an external I/O bus having an bus voltage, the output switch including a gate terminal, a source/drain terminal, and a well terminal;
a well control circuit, having a well terminal coupled to the well terminal of the output switch, to maintain a well voltage of the output switch at a level not less than a greater of a first voltage and a second voltage;
an input switch coupled between the source/drain terminal of the output switch and the external I/O bus and operable to disconnect the output switch from the I/O bus;

a bias voltage generator, coupled to a gate terminal of the input switch, to maintain a bias voltage greater than a sum of the operating voltage of the output circuit and a threshold voltage of the input switch; and
a voltage discharging circuit coupled to the bias voltage generator, the well control circuit, and the gate terminal of the input switch to discharge the bias voltage generated by the bias voltage generator when the operating voltage of the output circuit decreases.

13. The circuit of claim 12, wherein
the first voltage is an operating voltage of the output circuit minus D1,
the second voltage is the bus voltage of the external I/O bus minus D2, and
each one of D1 and D2 is a positive value or zero.

14. The circuit of claim 12, wherein the well control circuit includes:
a first transistor having a gate terminal for receiving the bus voltage of the external I/O bus, a first source/drain terminal, a second source/drain terminal for receiving the operating voltage of the output circuit, and a well terminal; and
a second transistor coupled in series with the first transistor and having a gate terminal for receiving the operating voltage of the output circuit, a first source/drain terminal coupled to the first source/drain terminal of the first transistor, a second source/drain terminal for receiving the bus voltage of the external I/O bus, and a well terminal, coupled to the well terminal of the first transistor and the first source/drain terminals of the first and second transistors, to serve as the well terminal of the well control circuit.

15. The circuit of claim 12, wherein the well control circuit includes:
a first transistor having a gate terminal for receiving the operating voltage of the output circuit, a first source/drain terminal, and a second source/drain terminal coupled to the gate terminal;
a second transistor having a gate terminal for receiving the bus voltage of the external I/O bus, a first source/drain terminal coupled to the first source/drain terminal of the first transistor, and a second source/drain terminal coupled to the gate terminal; and
a well terminal, coupled to the first source/drain terminals of the first and second transistors, to serve as the well terminal of the well control circuit.

16. The circuit of claim 12, wherein the well control circuit includes:
a first transistor having a gate terminal, a first source/drain terminal, a second source/drain terminal for receiving the operating voltage of the output circuit, and a well terminal; and
a second transistor having a gate terminal coupled to the gate terminal of the first transistor and to the first source/drain terminal of the first transistor, a first source/drain terminal coupled to the first source/drain terminal of the first transistor, a second source/drain terminal for receiving the bus voltage of the external I/O bus, and a well terminal coupled to the well terminal of the first transistor, the first source/drain terminals of the first and second transistors and the gate terminals of the first and second transistors, to serve as the well terminal of the well control circuit.

* * * * *